United States Patent
Fornage et al.

(10) Patent No.: US 9,793,854 B2
(45) Date of Patent: Oct. 17, 2017

(54) METHOD AND APPARATUS FOR GROUND FAULT DETECTION

(71) Applicant: Enphase Energy, Inc., Petaluma, CA (US)

(72) Inventors: Martin Fornage, Petaluma, CA (US); Michael Harrison, Petaluma, CA (US)

(73) Assignee: Enphase Energy, Inc., Petaluma, CA (US)

( * ) Notice: Subject to any disclaimer, the term of this patent is extended or adjusted under 35 U.S.C. 154(b) by 0 days.

(21) Appl. No.: 14/870,178

(22) Filed: Sep. 30, 2015

(65) Prior Publication Data

US 2016/0091554 A1   Mar. 31, 2016

Related U.S. Application Data

(63) Continuation-in-part of application No. 14/132,830, filed on Dec. 18, 2013, now abandoned.

(51) Int. Cl.
*H02S 50/10* (2014.01)
*G01R 27/18* (2006.01)
(Continued)

(52) U.S. Cl.
CPC .............. *H02S 50/10* (2014.12); *G01R 27/18* (2013.01); *H02S 50/00* (2013.01); *G01R 15/04* (2013.01); *G01R 15/06* (2013.01)

(58) Field of Classification Search
USPC ........ 324/509, 510, 120, 705, 764.01, 76.11, 324/140 R, 548, 713, 765.01; 361/42, 18,
(Continued)

(56) References Cited

U.S. PATENT DOCUMENTS 4,206,398 A * 6/1980 Janning ................ G01R 31/021
                                                          324/509
4,809,123 A   2/1989 Allington et al.
(Continued)

FOREIGN PATENT DOCUMENTS

CN        103105537 A     5/2013
DE    102011007222 A1    10/2012
(Continued)

OTHER PUBLICATIONS

Mulcahy et al., "Considerations on Ground Fault Protection for Electric Vehicle", TDI Power, pp. 1-12, Feb. 2012.
(Continued)

*Primary Examiner* — Melissa Koval
*Assistant Examiner* — Nasima Monsur
(74) *Attorney, Agent, or Firm* — Moser Taboada

(57) ABSTRACT

Method and apparatus for determining a ground fault impedance. In one embodiment the apparatus comprises a voltage divider and a ground fault detection module for (i) determining a first voltage based on at least one voltage measurement of the voltage divider while the voltage divider is coupled between the first AC line and the DC line; (ii) determining a second voltage based on at least one voltage measurement of the voltage divider while the voltage divider is coupled between the second AC line and the DC line; (iii) determining a differential voltage based on at least one voltage measurement between the first AC line and the second AC line; and (iv) computing the ground fault impedance based on the first voltage, the second voltage, and the differential voltage.

20 Claims, 5 Drawing Sheets

(51) Int. Cl.
*H02S 50/00* (2014.01)
*G01R 15/04* (2006.01)
*G01R 15/06* (2006.01)

(58) Field of Classification Search
USPC ..... 361/30, 45, 63; 307/130, 31; 702/58, 64, 702/59; 318/490, 400.3
See application file for complete search history.

(56) References Cited

U.S. PATENT DOCUMENTS

| | | | |
|---|---|---|---|
| 5,334,912 A | 8/1994 | Counts | |
| 5,471,144 A * | 11/1995 | Meyer | G01R 31/1272 324/118 |
| 5,481,194 A | 1/1996 | Schantz et al. | |
| 5,774,316 A | 6/1998 | McGary et al. | |
| 6,347,025 B1 * | 2/2002 | Ulrich | H05B 6/04 361/42 |
| 6,678,132 B1 | 1/2004 | Carruthers et al. | |
| 6,856,137 B2 | 2/2005 | Roden et al. | |
| 8,049,455 B2 | 11/2011 | Kitanaka | |
| 8,373,420 B2 | 2/2013 | Lupaczyk et al. | |
| 8,390,297 B2 | 3/2013 | Beck et al. | |
| 8,531,804 B2 | 9/2013 | Weems, II et al. | |
| 2007/0008666 A1 | 1/2007 | Morita et al. | |
| 2008/0036466 A1 | 2/2008 | Raber | |
| 2010/0244760 A1 * | 9/2010 | Anwar | G01R 31/025 318/490 |
| 2011/0119755 A1 * | 5/2011 | Minato | H04N 1/00344 726/16 |
| 2011/0307196 A1 | 12/2011 | Schumacher et al. | |
| 2012/0026631 A1 | 2/2012 | Kazemi et al. | |
| 2012/0119755 A1 | 5/2012 | Ishii et al. | |
| 2013/0272039 A1 | 10/2013 | Saniter et al. | |

FOREIGN PATENT DOCUMENTS

| | | |
|---|---|---|
| DE | 102012104752 B3 | 11/2013 |
| EP | 1345310 A1 | 9/2003 |
| EP | 2236343 A1 | 10/2010 |
| JP | S57173765 A | 10/1982 |
| JP | H04166773 A | 6/1992 |
| JP | H06153301 A | 5/1994 |
| JP | H08226950 A | 9/1996 |
| JP | 2004053367 A | 2/2004 |
| JP | 2007327856 A | 12/2007 |
| WO | WO-2008061357 A1 | 5/2008 |

OTHER PUBLICATIONS

European Office Action dated May 18, 2015 for European Application No. 14195500.5, 4 pages.

Fischer et al., "Methods for Detecting Ground Faults in Medium-Voltage Distribution Power Systems", pp. 1-19.

* cited by examiner

METHOD AND APPARATUS FOR GROUND FAULT DETECTION

CROSS-REFERENCE TO RELATED APPLICATIONS

This application is a continuation-in-part of co-pending U.S. patent application Ser. No. 14/132,830, filed Dec. 18, 2013, which is herein incorporated in its entirety by reference.

BACKGROUND OF THE INVENTION

Field of the Invention

Embodiments of the present disclosure generally relate to ground fault detection and, more particularly, to a method and apparatus for detecting a ground fault.

Description of the Related Art

Solar panels, or photovoltaic (PV) modules, convert energy from sunlight received into direct current (DC). The PV modules cannot store the electrical energy they produce, so the energy must either be dispersed to an energy storage system, such as a battery or pumped hydroelectricity storage, or dispersed by a load. One option to use the energy produced is to employ one or more inverters to convert the DC current into an alternating current (AC) and couple the AC current to the commercial power grid. The power produced by such a distributed generation (DG) system can then be sold to the commercial power company.

In order to couple generated power to a commercial AC power grid, inverters must meet certain safety standards such as determining whether a fault to ground condition exists on the DC side and disabling power production if such a condition does exist. Having a ground reference at the inverter for measuring ground fault currents requires propagating the ground from the inverter back to the grid, resulting in additional wiring and therefore costs to support the ground connection.

Therefore, there is a need in the art for a method and apparatus for detecting a ground fault condition without connecting to a ground reference.

SUMMARY OF THE INVENTION

Embodiments of the present invention generally relate to determining a ground fault impedance as shown in and/or described in connection with at least one of the figures, as set forth more completely in the claims.

These and other features and advantages of the present disclosure may be appreciated from a review of the following detailed description of the present disclosure, along with the accompanying figures in which like reference numerals refer to like parts throughout.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
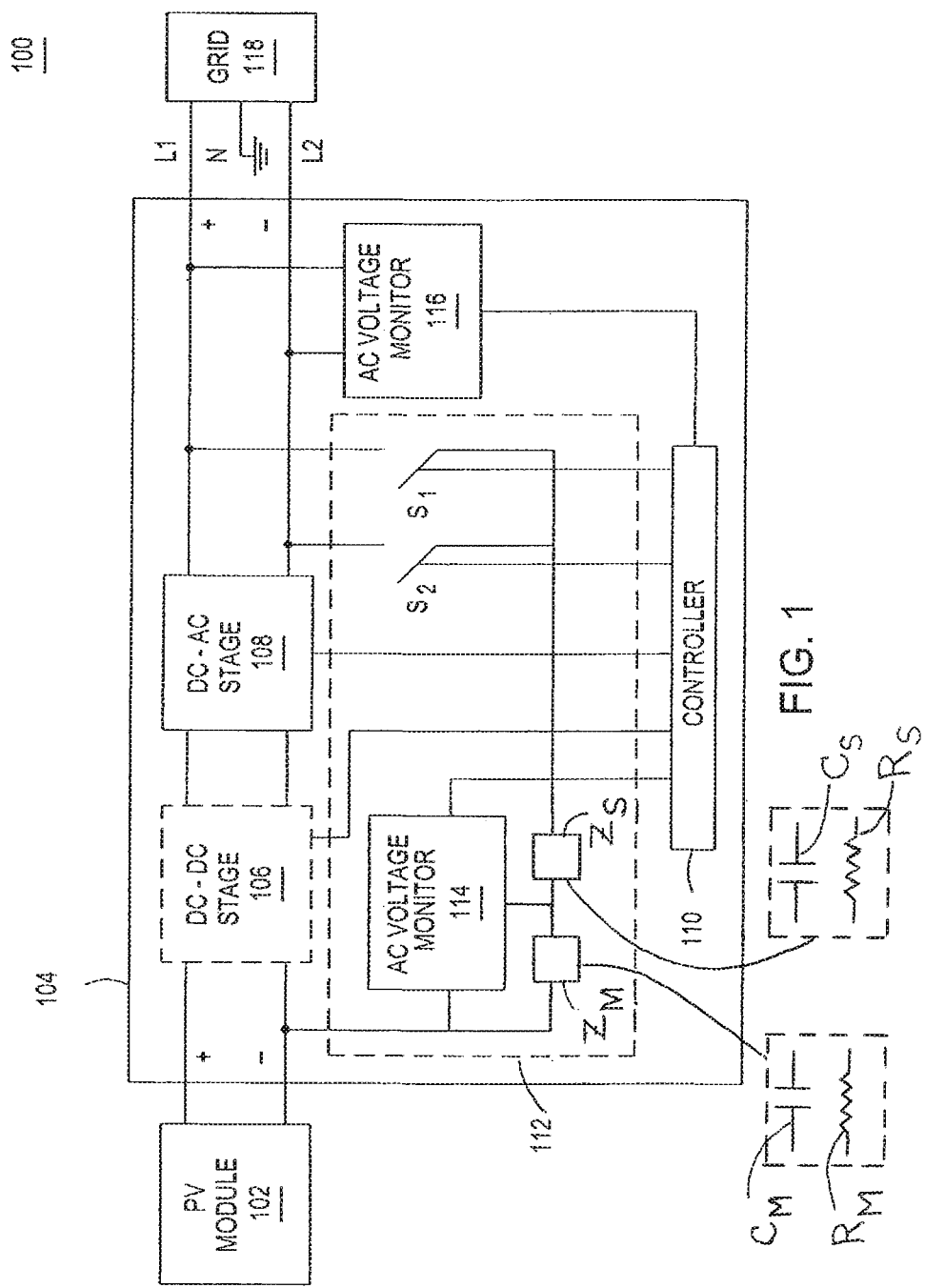
FIG. 1 is a block diagram of a power distribution system in accordance with one or more embodiments of the present invention.

FIG. 1 is a block diagram of a power distribution system 100 in accordance with one or more embodiments of the present invention. The power distribution system 100 ("system 100") comprises a photovoltaic (PV) module 102 coupled across an inverter 104, which is further coupled to an AC power distribution grid 118 ("grid 118"). The inverter 104 converts DC power from the PV module 102 to commercial grid compliant AC power and couples the generated AC power to the grid 118. As depicted in FIG. 1, the grid 118 comprises a first phase line L1, a second phase line L2, and a neutral line N coupled to ground, where the lines L1 and L2 are coupled to the inverter positive and negative outputs, respectively. In other embodiments the grid 118 may have other topologies, such as a single phase line and a grounded neutral line, three phase lines with a grounded connection, and the like.

In some embodiments, the inverter 104 may additionally or alternatively receive DC power from one or more suitable DC sources other than the PV module 102, such as other types of renewable energy sources (e.g., wind turbines, a hydroelectric system, or similar renewable energy source), a battery, or the like. In some alternative embodiments, multiple DC sources may be coupled to the inverter 104 (e.g., the inverter 104 may be a string inverter or a single centralized inverter).

The inverter 104 comprises a DC-DC stage 106 coupled across a DC-AC stage 108, an AC voltage monitor 116 coupled across the output of the DC-AC stage 108, and a controller 110 coupled to each of the DC-DC stage 106, the DC-AC stage 108, and the AC voltage monitor 116. The DC-DC stage 106 receives a DC input from the PV module 102 and converts the received DC power to a second DC power as controlled by the controller 110. The DC-AC stage 108 then converts the DC power from the DC-DC stage 106 to a single-phase AC output power as controlled by the controller 110 and couples the output power to lines L1 and L2 of the grid 118. The DC-AC stage 108 may be any suitable DC-AC inversion circuit, such as a cycloconverter, an H-bridge, or the like. In other embodiments the DC-AC stage 108 may generate other types of AC output, such as two-phase, split phase, or three-phase AC output. In some alternative embodiments, the DC-DC stage 106 may not be present and the DC-AC stage 108 receives the DC power from the PV module 102.

The AC voltage monitor 116 is coupled across the output from the DC-AC stage 108 for sampling the AC output voltage. The AC voltage monitor 116 measures the instantaneous AC output voltage (i.e., the differential voltage VL1-VL2 between lines L1 and L2) and provides the samples (i.e., signals indicative of the sampled voltage) to the controller 110. A phase lock loop (PLL) within the controller 110 locks on to the grid frequency and outputs the main time reference to the inverter 104. The controller 110 extracts the fundamental content from the grid voltage in both amplitude and phase; ideally, the phase should always be zero but could be skewed in the presence of heavy distortion. The controller 110 thus determines the AC output voltage as a vector—i.e., in terms of both amplitude and phase. The measured AC output voltage is used during ground fault detection (as described below) as well as power conversion. In some embodiments, the AC voltage monitor 116 may comprise an analog-to-digital (ND) converter for providing the samples in a digital form.

The inverter 104 further comprises a ground fault detection circuit 112. The ground fault detection circuit 112 comprises impedance elements $Z_m$ and $Z_s$, switches S1 and S2, and AC voltage monitor 114. The impedance elements $Z_m$ and $Z_s$ may be either resistors $R_m$ and $R_s$ or capacitors $C_m$ and $C_s$. The impedance elements $Z_m$ and $Z_s$ are coupled in series to form a voltage divider (e.g., formed of either a resistive divider or a capacitive divider). A first terminal of the impedance element $Z_m$ is coupled to the DC-DC stage negative input (although in other embodiments it may be coupled to the DC-DC stage positive input), a second terminal of the impedance element $Z_m$ is coupled to a first terminal of the impedance element $Z_s$, and the AC voltage monitor 114 is coupled across the impedance element $Z_m$. A second terminal of the impedance element $Z_s$ is coupled to switches S1 and S2. In some embodiments, in addition to being used for ground fault detection, the impedance elements $Z_s$ and $Z_m$ may provide electromagnetic interference (EMI) protection for the inverter 104; additional EMI protection capacitors may be coupled across $Z_s$ and $Z_m$ without significantly impacting the invention described herein.

The switches S1 and S2 are each bidirectional switches (e.g., back-to-back metal-oxide-semiconductor field-effect transistors (MOSFETs), relay contacts, or the like) and are coupled between the second terminal of the element $Z_s$ and the DC-AC stage positive and negative outputs, respectively. The switches S1 and S2 as well as the AC voltage monitor 114 are further coupled to the controller 110.

In accordance with one or more embodiments of the present invention, the ground fault detection circuit 112 is used for determining whether a ground fault condition exists without requiring a connection to ground at the inverter 104. Since no ground connection is needed, the system topology can be simplified—for example, no ground wire is needed within cabling to the inverter 104, groundless casing for the inverter 104 may be used (e.g., the inverter casing may be made of plastic or other nonconductive materials), and no ground connections are needed for the inverter 104. The inverter 104 is thus a groundless inverter and would be safety certified under the "Double Insulated" classification.

In order to determine whether a ground fault condition exists, the grid-side voltage is used to induce current flow through the impedance elements $Z_s$ and $Z_m$ via any potential ground fault that might exist on the DC side of the inverter 104 back to ground. The impedance of the ground fault can then be determined by measuring the AC voltage generated across impedance element $Z_m$ as follows. During a period when the inverter 104 is not generating power, the switch S1 is closed (as controlled by the controller 110) to couple the grid-side line L1 to the DC-DC stage negative input through the impedance divider formed by elements $Z_s$ and $Z_m$. The impedances at $Z_s$ and $Z_m$ are selected to scale the voltage generated across element $Z_m$ to a value suitable for the AC voltage monitor 114 to measure; generally the selection is such that the voltage across $Z_m$ is much lower than the voltage across $Z_s$, for example the capacitive divider may provide a voltage reduction on the order of 30-to-1. In order to provide required safety isolation between the DC and AC ports, one or both of the elements $Z_m$ and $Z_s$ are suitably either safety-rated capacitors or safety-rated resistors. In some embodiments, $Z_s$ is a safety-rated capacitor, such as a Y1, Y2, or Y3 safety-rated, having a capacitance value of the maximum limit at 4.7 nanofarads (nF), and $Z_m$ has capacitances of 150 nF (for a 33:1 voltage divider for example). In other embodiments, $Z_s$ and $Z_m$ are a safety-rated resistors having a resistance of 1 Meg Ohm to several Meg Ohms. In one embodiment, the resistance of $Z_s$ may be 1 Meg Ohm and $Z_m$ has a resistance of 2 Meg Ohm (for a 33:1 voltage divider, for example). Since the resistors span the primary to secondary safety isolation barrier, their resistance should be very high such that the maximum leakage current specified by the various safety standards (typically 2 mA maximum) is not violated.

The AC voltage monitor 114 samples the voltage across the element $Z_m$ and provides such samples (i.e., signals indicative of the sampled voltage) to the controller 110. In some embodiments, the AC voltage monitor 114 may comprise an analog-to-digital (A/D) converter for providing the samples in a digital form. Based on the received voltage samples, the controller 110 determines a vector value V1 for the voltage across the element $Z_m$ when line L1 is coupled to the DC negative input through $Z_m/Z_s$. A number of voltage samples may be used by the controller 110 for determining V1, for example the controller 110 may compute an average of a plurality of voltage samples for determining V1.

The switch S1 is then opened and switch S2 is closed (as controlled by the controller 110) to couple the grid-side line L2 to the DC-DC stage negative input through the voltage divider formed by $Z_s$ and $Z_m$. The AC voltage monitor 114 again samples the voltage across the element $Z_m$ and provides the voltage samples (i.e., signals indicative of the sampled voltage) to the controller 110. Based on the received voltage samples, the controller 110 determines a vector value V2 for the voltage across the element $Z_m$ when the grid-side line L2 and the DC negative input are coupled through $Z_m/Z_s$. A number of voltage samples may be used by the controller 110 for determining V2, for example the controller 110 may compute an average of a plurality of voltage samples for determining V2. The switch S2 is then opened.

The activation/deactivation of the switches S1 and S2 is synchronized with the grid voltage waveform; for example, a phase lock loop (PLL) of the inverter 104, which is synchronized to the grid 118, may be used to synchronize the operation of the switches S1 and S2. In some embodiments, for example when the switches S1 and S2 are devices only able to switch at low frequency, the switches S1 and S2 are operated at a frequency less than or equal to the grid frequency and each remain closed for at least one grid cycle, although they main remain closed for a longer period to reduce noise in the readings. In some such embodiments, each of the switches S1 and S2 may be switched on for several grid cycles (e.g., 10 grid cycles). In other embodiments, the switches S1 and S2 may be operated at a frequency greater than the grid frequency, although they are generally operated at a frequency less than the converter switching frequency used for power conversion.

Based on the voltage samples obtained, the amplitude and phase for each of V1 and V2 is be evaluated; for example a single-bin fast Fourier transform (FFT) may be used to evaluate a single frequency (e.g., the grid frequency) for determining amplitude and phase for each of V1 and V2. Analogously, the amplitude and phase for the differential voltage VL1-VL2 is determined based on the voltage samples obtained by the AC voltage monitor 116. Generally, VL1-VL2 is measured continuously during the process of measuring and determining V1 and V2; if VL1-VL2 were to change between the times V1 and V2 are measured, then the measurement can be repeated until it is suitably stable.

Based on V1, V2, and the differential voltage VL1-VL2, the PV module impedance to ground Zpv is determined by the controller 110 as follows:

$$Zpv=Zs*(1-\alpha)/\alpha \quad (1)$$

where $$\alpha=[(V1-V2)/(VL1-VL2)]*Zs/Zm \quad (2)$$

and where Zs and Zm are the impedances of impedance element $Z_s$ and $Z_m$, respectively, and Zpv, Zs, and α are all vector quantities. The amplitude and/or phase of the determined PV module impedance to ground Zpv may then be evaluated by the controller 110 to determine whether a ground fault condition exists. For example, a ground fault condition may be determined to exist if the amplitude of Zpv is less than 10 kilo ohms; additionally or alternatively, a resistive leak (Zpv real) may be distinguished from a capacitive leak (Zpv ideal) based on the phase of Zpv. When a ground fault condition is determined, the controller 110 disables power production by the inverter 104 and may raise an alarm indicating the condition. The PV module impedance to ground may be determined periodically, such as each morning prior to inverter startup, to test for any ground fault conditions.

In some alternative embodiments, the ground fault detection circuit 112 may be an external component (i.e., not contained within the inverter 104); additionally or alternatively, circuitry for controlling the ground fault detection circuit 112 and/or determining the PV module impedance to ground Zpv (as well as any of the associated parameters) and evaluating whether a ground fault condition exists may be external to the inverter 104.

Figure 2:
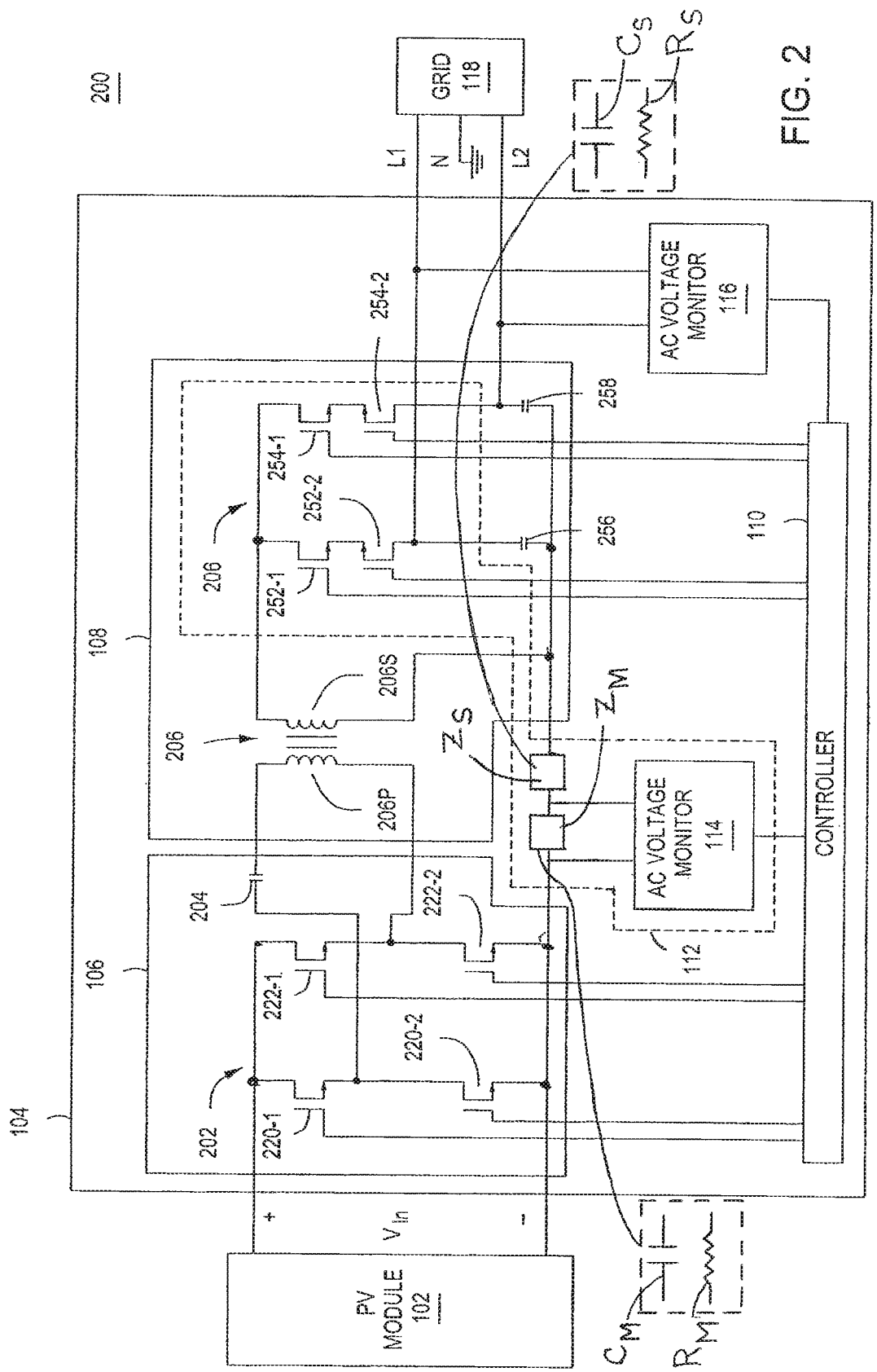
FIG. 2 is a block diagram of another embodiment of an inverter in accordance with one or more embodiments of the present invention.

FIG. 2 is a block diagram of another embodiment of an inverter 104 in accordance with one or more embodiments of the present invention. As previously described, the inverter 104 comprises the DC-DC stage 106 coupled to the DC-AC stage 108, each stage coupled to the controller 110, and the AC voltage monitor 116 coupled across the DC-AC stage output and to the controller 110.

The DC-DC stage 106 comprises an input bridge 202 and a capacitor 204, where the capacitor 204 is coupled to a first output terminal from the input bridge 202. The input bridge 202 is a full H-bridge comprising switches 220-1, 220-2, 222-1, and 222-2 (e.g., n-type metal-oxide-semiconductor field-effect transistors, or MOSFETs) arranged such that switches 220-1/220-2 and 222-1/222-2 form first and second legs (i.e., left and right legs), respectively, of the H-bridge. Gate and source terminals of each of the switches 220-1, 220-2, 222-1, and 222-2 are coupled to the controller 110 for operatively controlling the switches. In other embodiments, the switches 220-1, 220-2, 222-1, and 222-2 may be any other suitable electronic switch, such as insulated gate bipolar transistors (IGBTs), bipolar junction transistors (BJTs), p-type MOSFETs, gate turnoff thyristors (GTOs), and the like. The first output terminal of the input bridge 202 is coupled between the switches 220-1 and 220-2, and is also coupled to a first terminal of the capacitor 204. A second output terminal of the input bridge 202 is coupled between the switches 222-1 and 222-2. In alternative embodiments, the input bridge 202 may be another type of DC bridge, such as a half H-bridge.

The DC-AC stage 108 comprises a transformer 206 (e.g., at the border of the DC-AC stage 108) having a primary side 206p coupled across the DC-DC stage 106 and a secondary side 206s coupled across an AC bridge 250. The AC bridge 250 is an AC half-bridge that is a cycloconverter comprising switches 252-1, 252-2, 254-1, and 254-2 (e.g., MOSFETs or other suitable electronic switches) and capacitors 256 and 258; gate and source terminals of each of the switches 252-1, 252-2, 254-1, and 254-2 are coupled to the controller 110 for operatively controlling the switches. The switches 252-1 and 252-2 are coupled in series back-to-back (i.e., source terminals of the switches are coupled to one another) and are further coupled in series to a first terminal of the capacitor 256 to form a first leg of the AC bridge 250. Analogously, the switches 254-1 and 254-2 are coupled in series back-to-back and are further coupled in series to a first terminal of the capacitor 258 to form a second leg of the AC bridge 250. The first and second AC bridge legs are coupled in parallel to one another (i.e., drain terminals of the switches 252-1 and 254-1 are coupled to one another, and second terminals of the capacitors 256 and 258 are coupled to one another) and across the transformer secondary side 206s. The AC bridge 250 couples the AC output power to first and second output terminals coupled between the respective pairs of switches and capacitors. In certain embodiments, the capacitors 256 and 258 may be on the order of 1,000 nF, and the transformer 206 may have a turns ratio of 1:6.

In some alternative embodiments, the AC bridge 250 may be a different type of AC bridge circuit, such as a full H-bridge, a three-phase bridge (e.g., a three-phase cycloconverter) for coupling three-phase or split-phase AC output to the grid 118, and the like.

The inverter 104 also comprises the impedance element $Z_m$ and $Z_s$ coupled in series between the DC-DC stage negative input terminal (i.e., the source terminals of the switches 220-2 and 222-2) and the DC-AC stage negative input terminal (i.e., the second terminals of the capacitors 256 and 258), although in other embodiments the series combination of $Z_s$ and $Z_m$ may be coupled between the capacitor 204 and the primary winding 206P. The AC voltage monitor 114 is coupled across the capacitor $Z_m$. As previously described, one or both of the elements $Z_m$ and $Z_s$ are suitably safety-rated capacitors, and in some embodiments $Z_s$ is a "Y1" safety-rated capacitor having a capacitance value of 4.7 nF and $Z_m$ has a capacitance of 150 nF (to provide a typical voltage divider ratio—e.g., 33:1 for these capacitor values). In some alternative embodiments, one or both of the capacitors $Z_m$ and $Z_s$ may be replaced with other types of suitably safety-rated impedance elements such as safety-rated resistors. In one embodiment, the resistor $R_m$ and $R_s$ may have resistance valves of 1 Meg Ohm and 2 Meg Ohm, respectively, to provide a 33:1 voltage divider ratio.

In accordance with one or more embodiments of the present invention, the AC bridge switches are utilized to drive the impedance network connected between the inverter AC and DC ports in order to detect a fault to ground on the PV module 102. As such, the elements $Z_m$ and $Z_s$, the AC voltage monitor 114, and the switches 252-1, 252-2, 254-1 and 254-2 form another embodiment of the ground fault detection circuit 112, where switch pair 252-1/252-2 is activated to couple the capacitive divider between AC line L1 and the negative DC input terminal, and the switch pair 252-1/252-2 is activated to couple the capacitive diver between AC line L2 and the negative DC input terminal. The element $Z_s$ is thus driven with an AC stimulus from the AC-side AC bridge 250 such that the stimulus will try to drive a current flow through the voltage divider formed by $Z_m$ and $Z_s$ via any potential ground fault on the DC side back to ground. As previously described, the voltage generated across the element $Z_m$ is measured and used to compute the PV module impedance to ground Zpv for determining whether a ground fault condition exists.

In some embodiments, the AC bridge switches are driven for ground fault detection when the inverter 104 is not generating power (e.g., prior to inverter startup each morning). In such embodiments, the AC bridge switches are synchronized with the grid voltage waveform (e.g., via a phase lock loop (PLL) of the inverter 104) and may be cycled at a frequency less than or equal to the grid frequency (i.e., the switches are operated for an integer number of grid cycles), greater than the grid frequency but lower than their normal (i.e., power generating) operating frequency, or at/proximate their normal operating frequency. In certain embodiments, the AC bridge switches may be cycled at a frequency lower than the grid frequency; for example, the switch pair 252-1/252-2 may be switched on for several grid cycles (e.g., 10 grid cycles) and the voltage across $Z_m$ measured, then subsequently the switch pair 254-1/254-2 may be switched on for several grid cycles (e.g., 10 grid cycles) and the voltage across $Z_m$ measured again. As previously described, a determination of whether a ground fault condition exists may be made based on the voltages measures across $Z_m$ as well as the voltage measured across lines L1 and L2 by the AC voltage monitor 116.

In other embodiments, the ground fault detection occurs while the AC bridge switches are driven for generating power. In such embodiments, the AC bridge switching modulation is not modified from the switching that occurs during normal power production and the ground fault detection operates with this particular switching frequency and modulation. Since the switching frequency, magnitude and modulation detail is dictated by the power conversion control requirements, the values for $Z_s$ and $Z_m$ are chosen accordingly; i.e., the ground fault detection function can be treated as a secondary function which is designed once the power conversion design has been finalized and suitable values for $Z_s$ and $Z_m$ can be easily determined. The voltage across $Z_m$ can then be measured for determining whether a ground fault condition exists, as previously described. If it is determined that a ground fault condition exists, the controller 110 disables power production and may additionally generate an alarm indicating the condition.

In some alternative embodiments, the inverter 104 may generate a different type of AC output, such as a two-phase output, a split-phase output, or a three-phase output, and be coupled to the grid 118 accordingly. In such embodiments, ground fault detection may be done by a technique analogous to technique described above.

In addition to determining whether a ground fault exists, the computed PV module impedance to ground may be used for other applications. For example, based on the PV module impedance to ground a determination may be made whether the PV module 102 is wet (e.g., due to rain, dew, and the like). Since the impedance to ground on the PV module 102 is reduced significantly when the PV module 102 is wet as compared to when it is dry, the controller 110 may compare the PV module impedance to ground to a suitable threshold or to previously determine values for determining whether the PV module 102 is wet. Such information may be used, for example, to identify whether the PV modules need to be cleaned (e.g., after a rainstorm the PV module 102 may be considered sufficiently clean).

Further, the computed PV module impedance to ground may be used to identify particular types of fault issues. For example, since the voltages V1, V2, and VL1-VL2 are vectors, not only can the resistance to ground be determined, but also the capacitance to ground and/or inductance to ground as well. Such information may be used to discriminate between resistive issues, capacitive issues, and the like.

Furthermore, the voltage information obtained for computing the PV module impedance to ground may be used to determine the topology of the grid connection. For example, based on the ratio of the voltages V1 and V2, a determination can be made whether the connection to the grid 118 is a three-phase connection, two phases of a three-phase connection, what the voltage to ground is, and the like.

Figure 3:
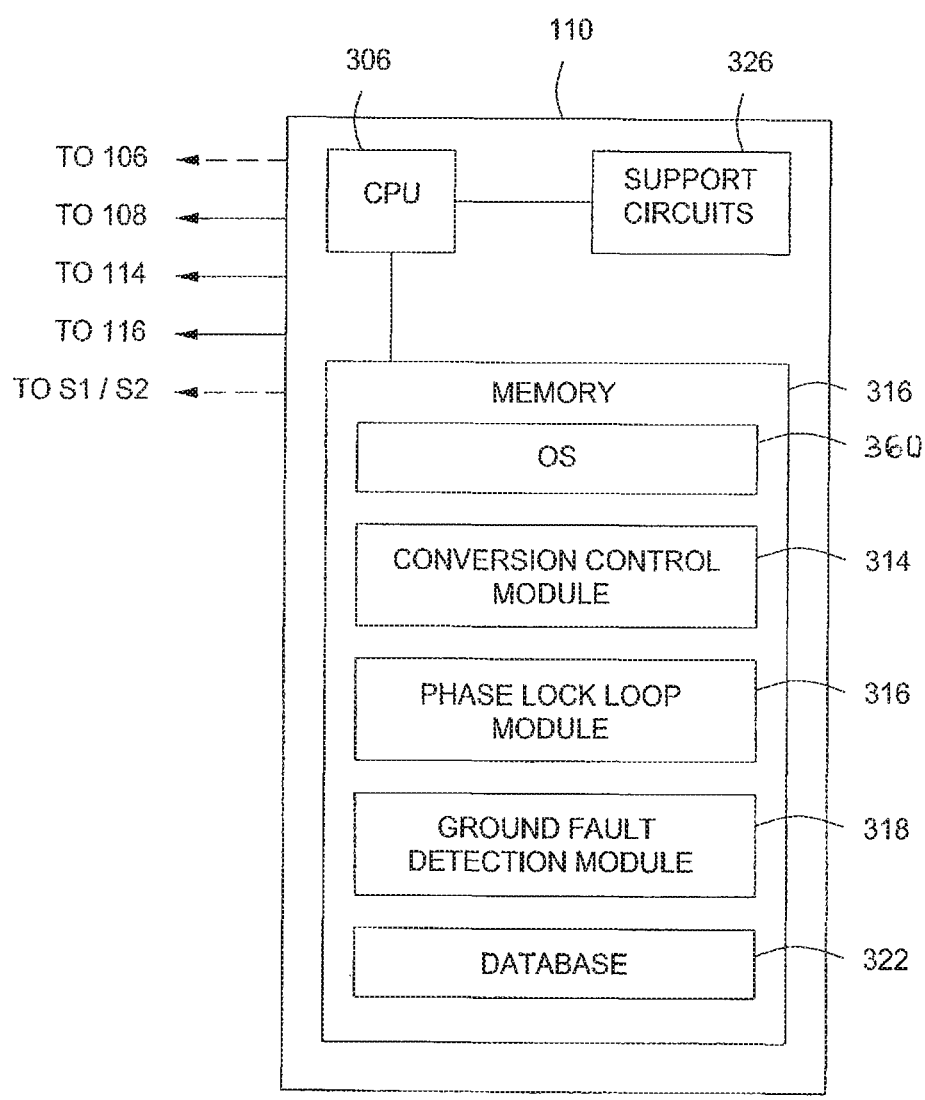
FIG. 3 is a block diagram of a controller in accordance with one or more embodiments of the present invention.

FIG. 3 is a block diagram of a controller 110 in accordance with one or more embodiments of the present invention. The controller 110 comprises at least one central processing unit (CPU) 306, which is coupled to support circuits 326 and to a memory 316. The CPU 306 may comprise one or more processors, microprocessors, microcontrollers and combinations thereof configured to execute non-transient software instructions to perform various tasks in accordance with the present invention. The CPU 306 may additionally or alternatively include one or more application specific integrated circuits (ASICs). The support circuits 326 are well known circuits used to promote functionality of the CPU 306. Such circuits include, but are not limited to, a cache, power supplies, clock circuits, buses, network cards, input/output (I/O) circuits, and the like. The controller 110 may be implemented using a general purpose computer that, when executing particular software, becomes a specific purpose computer for performing various embodiments of the present invention.

The memory 316 may comprise random access memory, read only memory, removable disk memory, flash memory, and various combinations of these types of memory. The memory 316 is sometimes referred to as main memory and may, in part, be used as cache memory or buffer memory. The memory 316 generally stores the operating system (OS) 360 of the controller 110. The operating system 360 may be one of a number of commercially available operating systems such as, but not limited to, Linux, Real-Time Operating System (RTOS), and the like.

The memory 316 stores non-transient processor-executable instructions and/or data that may be executed by and/or used by the CPU 306. These processor-executable instructions may comprise firmware, software, and the like, or some combination thereof.

The memory 316 may store various forms of application software, such as a conversion control module 314 for controlling operation of the DC-DC stage 106 (when present in the inverter 104) and the DC-AC stage 108, and a phase lock loop (PLL) module 316 for generating a signal synchronous with the grid waveform. The memory 316 may further comprise a ground fault detection module 318 for determining whether a ground fault condition exists as described herein. One embodiment of the functionality of the ground fault detection module 318 is described below with respect to FIG. 4.

The memory 316 may additionally comprise a database 322 for storing data related to the operation of the inverter 104 and/or data related to the present invention (e.g., one or more thresholds used in determining whether a ground fault condition exists or a PV module is wet, data used in identifying a type of grid connection, previously computed values of the PV module ground fault impedance, and the like).

In some embodiments, one or more of the conversion control module 314, the PLL module 316, the ground fault detection module 318, and the database 322, or portions thereof, may be implemented in software, firmware, hardware, or a combination thereof.

Figure 4:
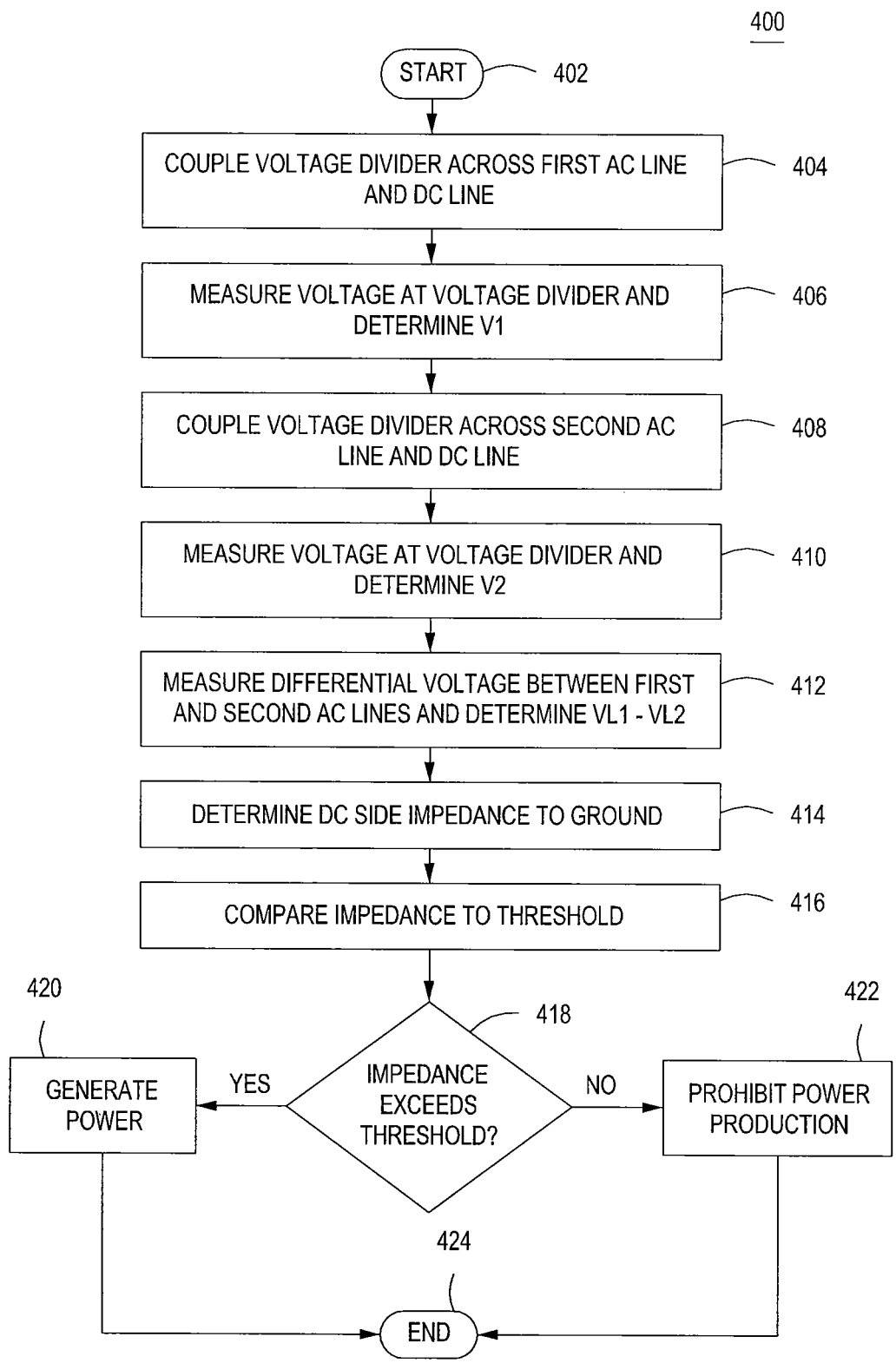
FIG. 4 is a block diagram of a method for determining whether a ground fault condition exists in accordance with one or more embodiments of the present invention.

FIG. 4 is a block diagram of a method 400 for determining whether a ground fault condition exists in accordance with one or more embodiments of the present invention.

In some embodiments, such as the embodiment described below, an inverter is coupled to a DC power source and to first and second phase lines of an AC power grid (e.g., the DC-AC inverter 104 coupled to the PV module 102 and the grid 118). The inverter may be coupled to a single DC power source (e.g., a single PV module), or, alternatively, to a plurality of DC power sources of the same or different types (e.g., the inverter may be a string inverter or a single centralized inverter). The DC power source may be any suitable DC source, such as a photovoltaic (PV) module, wind turbines, a hydroelectric system, other types of renewable energy sources, a battery, or the like.

The inverter converts DC power from the DC power source to AC power and couples the AC power to the AC power grid. In the embodiment described below, the inverter generates single-phase AC power and couples the generated power to first and second phase line of the AC power grid. In other embodiments, the inverter may generate and couple to the grid other types of AC power, such as two-phase, split-phase, or three-phase power, and the method 400 may be used accordingly for determining whether a ground fault condition exists.

Additionally, the inverter requires no ground connection for determining whether a ground fault condition exists on the DC side, as described below, and thus is a groundless inverter.

The method 400 begins at step 402 and proceeds to step 404. At step 404 a voltage divider is coupled between the first AC phase line at the inverter output and a DC line on the inverter input. The voltage divider may be defined by a plurality of impedance elements e.g., impedance elements $Z_m$ and $Z_s$. More specifically, the voltage divider may be a capacitive divider such as the capacitive divider formed by capacitors Cs and Cm; alternatively any type of suitably safety-rated device may be used in the voltage divider (e.g., the voltage divider may be formed by two series resistors $R_s$ and $R_m$).

The method 400 proceeds to step 406, where the voltage is measured across one of the elements of the voltage divider, e.g., the voltage is measured across the element $Z_m$. As previously described, the first voltage V1 is then determined based on the measured voltage, where the first voltage V1 is a vector quantity.

At step 408, the voltage divider is disconnected from the first AC line and coupled between the second AC phase line at the inverter output and the DC line on the inverter input.

In some embodiments, the inverter is not producing power when the voltage divider is coupled across the AC and DC lines during steps 404 and 408. In such embodiments, the voltage divider may be coupled across the AC and DC lines by activating a switch between the desired AC line and the voltage divider, such as one of the switches S1 or S2, or by activating one or more switches within an AC output bridge of the inverter (e.g., one of the AC bridge switches 252-1/252-2 or 254-1/254-2). The activation/deactivation of such switches is synchronized with the grid voltage, for example by a phase lock loop (PLL) of the inverter, and may be at a frequency lower than or equal to the grid voltage (e.g., the voltage divider may be coupled across the first AC line and the DC line for several grid cycles, then subsequently coupled across the second AC line and the DC line for several grid cycles); alternatively such switches may be operated at a frequency greater than the grid frequency but generally less than or equal to the normal converter switching frequency for generating power.

In other embodiments, the inverter is producing power when the voltage divider is coupled across the AC and DC lines during steps 404 and 408. In such embodiments, AC bridge switches on the AC side of the inverter (e.g., the switches of the AC bridge 250) are utilized for coupling the voltage divider across the lines as previously described.

The method 400 proceeds to step 410 where the voltage is measured across the same voltage divider element as in step 406 (e.g., across the element $Z_m$). As previously described, the second voltage V2 is then determined based on the measured voltage, where the second voltage V2 is a vector quantity. For those embodiments where a switch other than an AC bridge switch is utilized for coupling the voltage divider across the AC and DC lines, the voltage divider is disconnected from the AC line following the voltage measurement.

At step 412, the differential voltage between the first and second AC phase lines is measured (e.g., by the AC voltage monitor 116) and the vector quantity VL1-VL2 is determined as previously described. The method 400 then proceeds to step 414, where the DC-side impedance to ground Zpv is determined as previously described. The method 400 then proceeds to step 416 where the amplitude and/or phase of the impedance to ground Zpv is compared to a threshold.

At step 418, a determination is made whether the impedance exceeds the threshold. If it is determined that the impedance does exceed the threshold, the method 400 proceeds to step 420. At step 420, power is generated by the inverter. In those embodiments where the ground fault impedance detection is performed when the inverter is not generating power, power production begins in the inverter. In those embodiments where the ground fault impedance detection is performed while the inverter is generating power, the power production continues.

If, at step 418, it is determined that the impedance does not exceed the threshold, the method 400 proceeds to step 422 where power production by the inverter is disabled. In those embodiments where the ground fault impedance detection is performed when the inverter is not generating power, power production is prevented from starting up in the inverter. In those embodiments where the ground fault impedance detection is performed while the inverter is generating power, the power production is stopped. Additionally, an alarm may be raised indicating the ground fault condition.

The method 400 proceeds from either step 420 or step 422 to step 424 where it ends. In some embodiments of the method 400, phase information for the DC-side impedance to ground Zpv may be used to distinguish a resistive leak (Zpv real) from a capacitive leak (Zpv ideal), for example as part of determining whether to inhibit power production.

Figure 5:
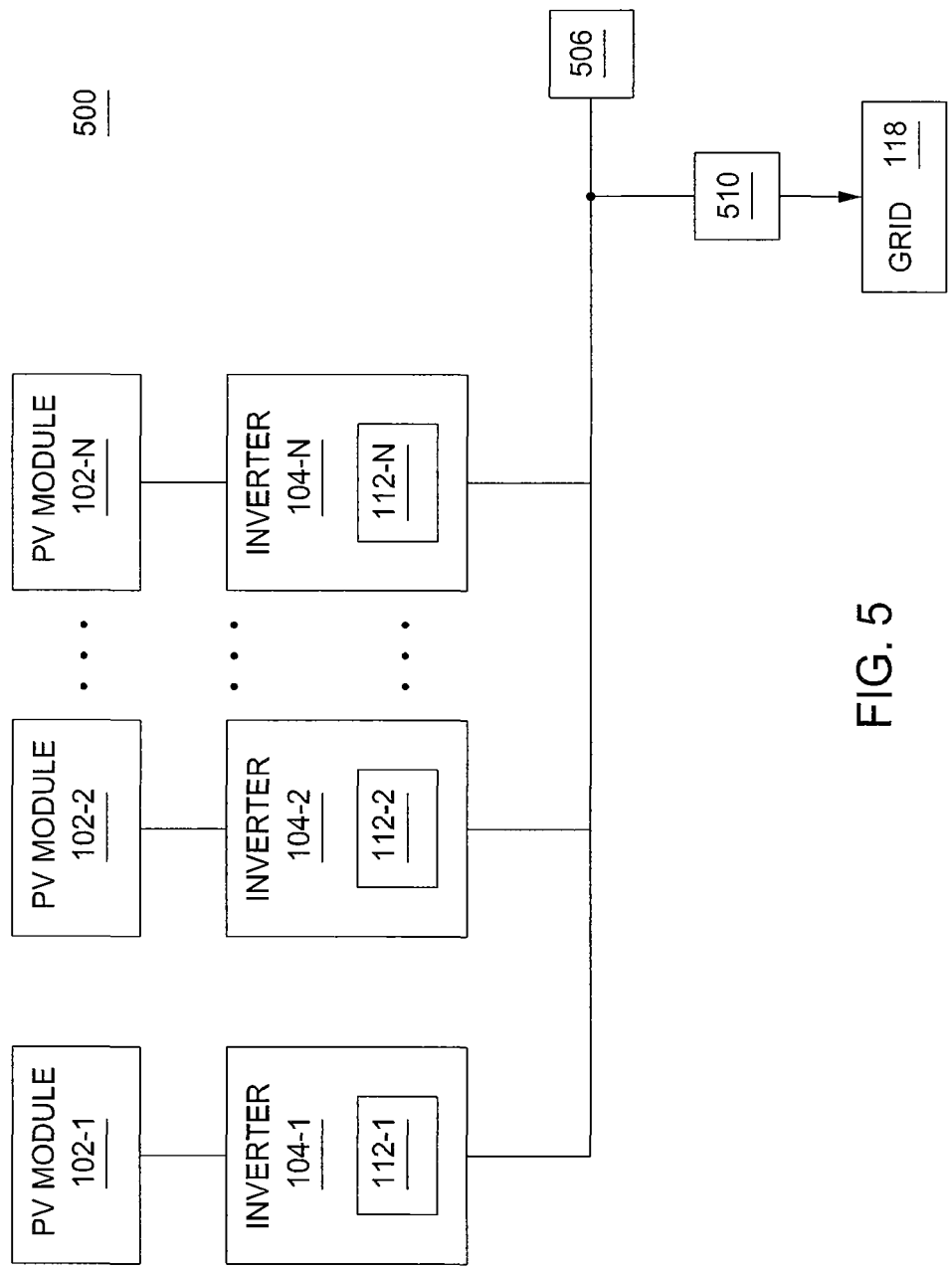
FIG. 5 is a block diagram of a system for power conversion comprising one or more embodiments of the present invention.

FIG. 5 is a block diagram of a system 500 for power conversion comprising one or more embodiments of the present invention. This diagram only portrays one variation of the myriad of possible system configurations and devices that may utilize the present invention. The present invention can be utilized in any DC-AC system or device requiring DC-side ground fault detection.

The system 500 comprises a plurality of inverters 104-1, 104-2 . . . 104-N, collectively referred to as inverters 104; a plurality of PV modules 102-1, 102-2 . . . 102-N, collectively referred to as PV modules 102; a system controller 506; a bus 508; a load center 510, and a grid 118. In other embodiments, one or more of the PV modules 102 may be any other type of suitable DC source, such a battery, another type of renewable energy source (e.g., a wind turbine, a hydroelectric system, or similar renewable energy source), or the like, for providing DC power.

Each inverter 104-1, 104-2 . . . 104-N is coupled to a single PV module 102-1, 102-2 . . . 102-N, respectively; in some alternative embodiments, multiple PV modules 102 may be coupled to a single inverter 104, for example a string inverter or a single centralized inverter. Each of the inverters 102 comprises a ground fault detection circuit 112 (i.e., the inverters 104-1, 104-2 . . . 104-N comprise the ground fault detection circuits 112-1, 112-2 . . . 112-N, respectively).

The inverters 104 are coupled to the system controller 506 via the bus 508. The system controller 506 is capable of communicating with the inverters 104 by wireless and/or wired communication for providing operative control of the inverters 104. The inverters 104 are further coupled to the load center 510 via the bus 508.

The inverters 104 are each capable of converting the received DC power to AC power. The generated power is then further coupled to the grid 118. As previously described, the inverters 102 may generate single-phase AC power, two-phase AC power, split-phase AC power, or three-phase AC power. The generated power is coupled to the load center 510 via the bus 508, and then further to the grid 118. In certain embodiments, the system 500 may be a serially connected micro-inverter (SCMI) system, for example with SCMI redundancy management.

The ground fault detection circuits 112 operate as previously described for determining whether a DC-side ground fault condition exists. If a ground fault condition is detected, power production in the corresponding inverter 104 is disabled.

The foregoing description of embodiments of the invention comprises a number of elements, devices, circuits and/or assemblies that perform various functions as described. These elements, devices, circuits, and/or assemblies are exemplary implementations of means for performing their respectively described functions.

While the foregoing is directed to embodiments of the present invention, other and further embodiments of the invention may be devised without departing from the basic scope thereof, and the scope thereof is determined by the claims that follow.

The invention claimed is:

1. A method for determining a ground fault impedance, comprising:
    coupling a voltage divider between a first AC line on an AC side of an inverter and a DC line on a DC side of the inverter;
    determining a first voltage based on at least one voltage measurement of the voltage divider while the voltage divider is coupled between the first AC line and the DC line;
    uncoupling the voltage divider from the first AC line;
    coupling, subsequent to uncoupling the voltage divider from the first AC line, the voltage divider between a second AC line on the AC side of the inverter and the DC line;
    determining a second voltage based on at least one voltage measurement of the voltage divider while the voltage divider is coupled between the second AC line and the DC line;
    determining a differential voltage based on at least one voltage measurement between the first AC line and the second AC line; and
    computing the ground fault impedance based on the first voltage, the second voltage, and the differential voltage.

2. The method of claim 1, wherein the first voltage, the second voltage, and the differential voltage are all vector quantities.

3. The method of claim 1, wherein the voltage divider is either a capacitive divider or a resistive divider.

4. The method of claim 3, further comprising:
    activating a first switch to couple the voltage divider between the first AC line and the DC line; and
    activating a second switch to couple the voltage divider between the second AC line and the DC line.

5. The method of claim 4, wherein the first switch and the second switches are part of an AC bridge that generates AC power.

6. The method of claim 5, wherein the inverter is generating power when the voltage divider is coupled between either the first AC line and the DC line or the second AC line and the DC line.

7. The method of claim 1, wherein the ground fault impedance is equal to $Zs*(1-\alpha)$, where $\alpha=[(V1-V2)/(VL1-VL2)]*Zs/Zm$, V1=the first voltage, V2=the second voltage, (VL1-VL2)=the differential voltage, Zs=an impedance of a first component of the voltage divider, and Zm=an impedance of a second component of the voltage divider.

8. The method of claim 1, further comprising comparing the ground fault impedance to a threshold for determining whether a ground fault condition exists.

9. An apparatus for determining a ground fault impedance, comprising:
    a voltage divider; and
    and a controller comprising at least one processor and a memory, the memory coupled to the at least one processor and having stored therein a ground fault detection module comprising computer executable code that, when executed by the at least one processor, (i) determines a first voltage based on at least one voltage measurement of the voltage divider while the voltage divider is coupled between a first AC line on an AC side of an inverter and a DC line on a DC side of the inverter; (ii) determines a second voltage based on at least one voltage measurement of the voltage divider while the voltage divider is coupled, subsequent to being uncoupled from the first AC line, between a second AC line on the AC side of the inverter and the DC line; (iii) determines a differential voltage based on at least one voltage measurement between the first AC line and the second AC line; and (iv) computes the ground fault impedance based on the first voltage, the second voltage, and the differential voltage.

10. The apparatus of claim 9, wherein the first voltage, the second voltage, and the differential voltage are all vector quantities.

11. The apparatus of claim 9, wherein the voltage divider is either a capacitive divider or a resistive divider.

12. The apparatus of claim 11, further comprising:
    a first switch for coupling the voltage divider between a first AC line on an AC side of an inverter and a DC line on a DC side of the inverter; and a second switch for coupling the voltage divider between a second AC line on the AC side of the inverter and the DC line.

13. The apparatus of claim 12, wherein the first switch and the second switches are part of an AC bridge that generates AC power.

14. The apparatus of claim 13, wherein the inverter is generating power when the voltage divider is coupled between either the first AC line and the DC line or the second AC line and the DC line.

15. The apparatus of claim 9, wherein the ground fault impedance is equal to $Zs*(1-\alpha)$, where $\alpha=[(V1-V2)/(VL1-VL2)]*Zs/Zm$, V1=the first voltage, V2=the second voltage, (VL1−VL2)=the differential voltage, Zs=an impedance of a first component of the voltage divider, and Zm=an impedance of a second component of the voltage divider.

16. The apparatus of claim 9, wherein the ground fault detection module further compares the ground fault impedance to a threshold for determining whether a ground fault condition exists.

17. A system for determining a ground fault impedance, comprising:
 a DC power source; and
 an inverter, coupled to the DC power source and to an AC grid, wherein the inverter comprises a voltage divider and a controller comprising at least one processor and a memory, the memory coupled to the at least one processor and having stored therein a ground fault detection module comprising computer executable code that, when executed by the at least one processor, (i) determines a first voltage based on at least one voltage measurement of the voltage divider while the voltage divider is coupled between a first AC line on an AC side of an inverter and a DC line on a DC side of the inverter; (ii) determines a second voltage based on at least one voltage measurement of the voltage divider while the voltage divider is coupled, subsequent to being uncoupled from the first AC line, between a second AC line on the AC side of the inverter and the DC line; (iii) determines a differential voltage based on at least one voltage measurement between the first AC line and the second AC line; and (iv) computes the ground fault impedance based on the first voltage, the second voltage, and the differential voltage.

18. The system of claim 17, wherein the first voltage, the second voltage, and the differential voltage are all vector quantities, and wherein the voltage divider is either a capacitive divider or a resistive divider.

19. The system of claim 17, wherein the inverter further comprises:
 a first switch for coupling the voltage divider between a first AC line on an AC side of the inverter and a DC line on a DC side of the inverter; and
 a second switch for coupling the voltage divider between a second AC line on the AC side of the inverter and the DC line.

20. The system of claim 19, wherein the first switch and the second switches are part of an AC bridge that generates AC power.

* * * * *